United States Patent
Lauterbach et al.

(10) Patent No.: US 7,170,121 B1
(45) Date of Patent: *Jan. 30, 2007

(54) COMPUTER SYSTEM ARCHITECTURE USING A PROXIMITY I/O SWITCH

(75) Inventors: Gary R. Lauterbach, Los Altos Hills, CA (US); Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/241,599

(22) Filed: Sep. 29, 2005

Related U.S. Application Data

(63) Continuation of application No. 10/983,250, filed on Nov. 4, 2004, now Pat. No. 6,958,538.

(51) Int. Cl.
*H01L 29/76* (2006.01)
*H01L 29/768* (2006.01)
*H03K 19/0175* (2006.01)

(52) U.S. Cl. ...................... 257/288; 257/341; 257/229; 257/723; 257/444; 257/E52.003; 257/E51.025; 257/E27.009; 174/53; 439/231; 326/82; 326/115; 716/14; 716/17

(58) Field of Classification Search ..................... None
See application file for complete search history.

(56) References Cited

U.S. PATENT DOCUMENTS

| | | | |
|---|---|---|---|
| 5,006,921 A | 4/1991 | Ishizuka et al. | 257/717 |
| 5,224,055 A | 6/1993 | Grundy et al. | 716/11 |
| 5,434,453 A | 7/1995 | Yamamoto et al. | 257/777 |
| 6,958,538 B1 * | 10/2005 | Lauterbach et al. | 257/723 |
| 6,968,391 B2 * | 11/2005 | Brennan et al. | 709/238 |
| 2001/0004227 A1 | 6/2001 | Frech et al. | 333/181 |
| 2004/0233652 A1 | 11/2004 | Sandy et al. | 361/788 |

* cited by examiner

*Primary Examiner*—Jasmine Clark
(74) *Attorney, Agent, or Firm*—Park, Vaughan & Fleming, LLP; Gilbert C. Wong

(57) ABSTRACT

One embodiment of the present invention provides a proximity I/O switch, which is configured to transfer data between the components in a computer system. This proximity I/O switch is comprised of multiple switch chips, which are coupled together through capacitive coupling. This enables the multiple switch chips to communicate with each other without being constrained by the limitations of conventional non-capacitive communication mechanisms. The multiple switch chips in the proximity I/O switch are also configured to communicate with components in the computer system through conventional non-capacitive communication mechanisms.

21 Claims, 3 Drawing Sheets

HERRINGBONE 202

CHECKERBOARD 204

MOSAIC 206

TIGHT CHECKERBOARD 208

CHIPS FACING UP

CHIPS FACING DOWN

AREA OF OVERLAP

COMPUTER SYSTEM ARCHITECTURE USING A PROXIMITY I/O SWITCH

RELATED APPLICATION

This application is a continuation of U.S. patent application Ser. No. 10/983,250, filed 4 Nov. 2004, now U.S. Pat. No. 6,958,538.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

The present invention relates to techniques for improving computer system performance by using a proximity I/O switch to facilitate communication between components within a computer system.

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, a semiconductor chip contains about 100 times more signal lines than a printed circuit board. Consequently, only a tiny fraction of the signal lines on a semiconductor chip can be routed across the printed circuit board to other chips. This problem is creating a bottleneck that is expected to worsen as semiconductor integration densities continue to increase.

This bottleneck can adversely affect computer system performance in a number of ways. For example, (1) it can limit the amount of data that can be transferred between processors and memories; (2) it can limit the amount of data that can be transferred between processors and other computer system components, such as peripheral devices and network interfaces; and (3) it can limit the amount of data that can be transferred between processors in a multiprocessor system.

SUMMARY

One embodiment of the present invention provides a proximity I/O switch, which is configured to transfer data between the components in a computer system. This proximity I/O switch is comprised of multiple switch chips, which are coupled together through capacitive coupling. This enables the multiple switch chips to communicate with each other without being constrained by the limitations of conventional non-capacitive communication mechanisms. The multiple switch chips in the proximity I/O switch are also configured to communicate with components in the computer system through conventional non-capacitive communication mechanisms.

In a variation on this embodiment, the multiple switch chips are alternately oriented face-up and face-down in an array, so that capacitive communication surfaces on active faces of the multiple switch chips overlap, thereby facilitating capacitive communication between the multiple switch chips.

In a further variation, the array of switch chips is two-dimensional so that corners of alternately oriented (face-up and face-down) switch chips overlap.

In a further variation, the multiple switch chips in the array are permanently or removably attached to one or more Micro-Electro-Mechanical System (MEMS) jig-plates, which are fabricated to accommodate the multiple switch chips.

In a further variation, switch chips on the perimeter of the two-dimensional array of switch chips are configured to communicate with the components in the computer system through the conventional non-capacitive communication mechanisms.

In a variation on this embodiment, the conventional non-capacitive communication mechanisms can include: electrically conductive connections, and optical communication mechanisms.

In a variation on this embodiment, the components in the computer system can include: processors, memories, peripheral devices, and network interfaces.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Proximity I/O Switch

Figure 1:
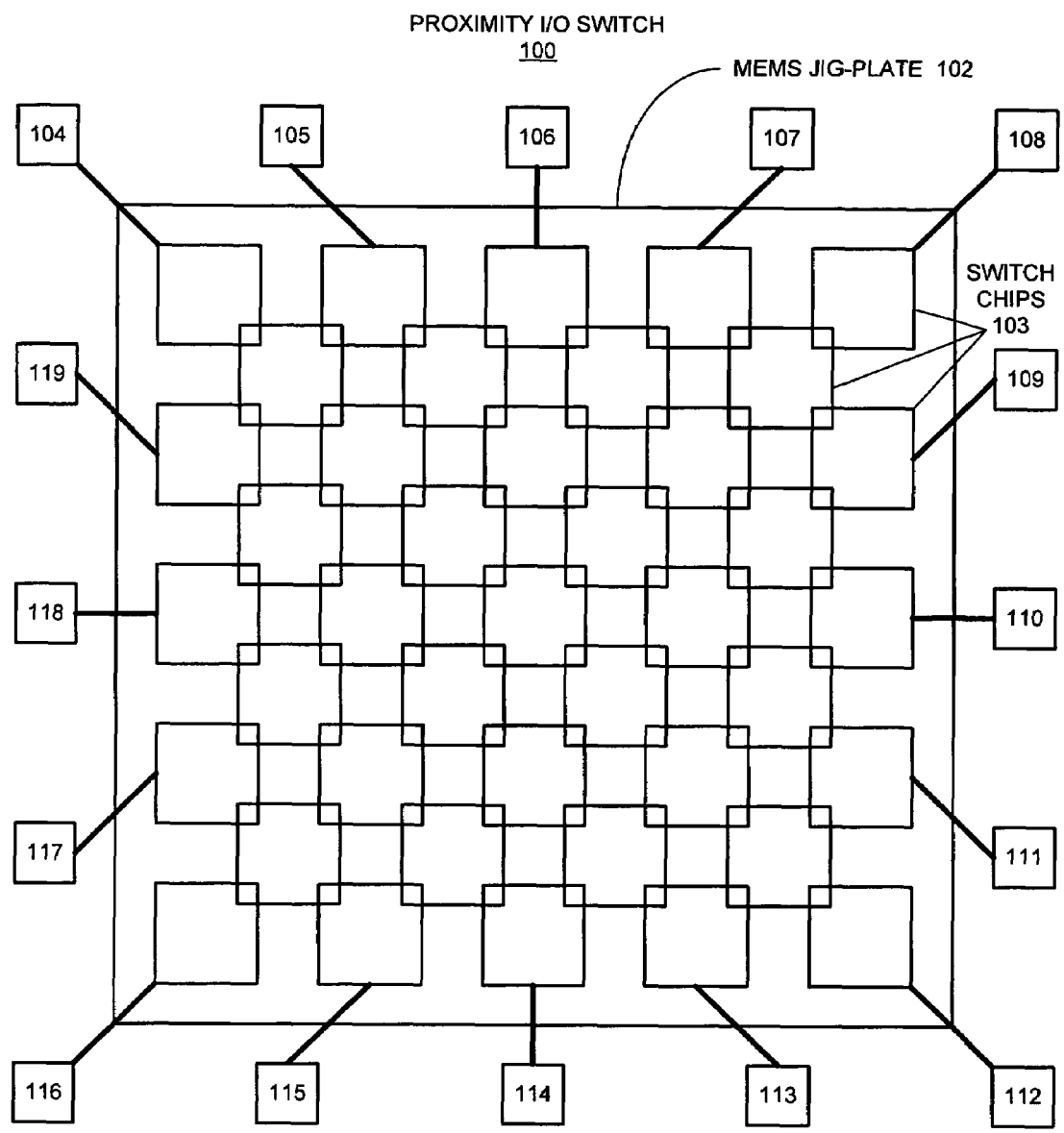
FIG. 1 illustrates a proximity I/O switch in accordance with an embodiment of the present invention.

FIG. 1 illustrates a proximity I/O switch 100 in accordance with an embodiment of the present invention. This proximity I/O switch 100 is comprised of a number of switch chips 103, which are alternately oriented face-up and face-down in an array as illustrated in FIG. 1. In this arrangement, capacitive communication surfaces on active faces of the multiple switch chips overlap, thereby facilitating capacitive communication between the multiple switch chips.

In the embodiment of the present invention illustrated in FIG. 1, switch chips on the perimeter of the array are coupled electrical-to-optical transceiver chips 104-119. Note that although these connections are represented using a single line in FIG. 1, each connection may actually involve hundreds of signal lines between the perimeter switch chips and the transceiver chips 104-119. These transceiver chips 104-119 provide optical communication paths to other system components, which are not illustrated in FIG. 1. (Note that in an alternative embodiment, electrical wire-based communication mechanisms can be used on the perimeter of the array instead of (or in addition to) optical communication mechanisms.)

In one embodiment of the present invention, the switch chips are sandwiched between two Micro-Electro-Mechanical System (MEMS) jig-plates. FIG. 1 illustrates a single MEMS jig-plate 102, which is affixed to switch chips that face upward, away from the page. Another opposing MEMS jig-plate (not shown) is affixed to switch chips that face downward, into the page.

These jig-plates contain alignment structures that precisely position switch chips that are placed between them. These alignment structures may include posts built up on the flat jig-plate surfaces. The switch chips may also be aligned by providing a cavity using a partial or full perimeter of posts. Alternately, the switch chips may be aligned by posts that fit through holes in the switch chips. Two holes per switch chip would be required, and more may be used to add redundancy. Note that aligning using a cavity requires less chip complexity, but also requires that the switch chips be trimmed to a precise size to fit the cavities. In contrast, aligning using posts and holes may provide greater accuracy because the holes on the switch chip could be created by etching the holes and using an annulus formed by the existent metal interconnect layers to guide the etching process.

Note that the switch chips do not need to be permanently attached to the jig-plates. This makes it possible to remove a switch chip from the proximity I/O switch if the switch chip is defective. Switch chips may be attached to the jig-plates by a mild adhesive to make it easier to handle and assemble the module. The adhesive could be as simple as water vapor, in which case no additional adhesive would be needed in an atmosphere that contains sufficient humidity. If more adhesion is required, then the surface could be coated with a suitable material. The adhesive may additionally have beneficial heat transfer properties, improving the thermal coupling between switch chip and jig-plate. A switch chip may be permanently attached to the jig-plate if there is no advantage to removing it in a particular application.

The jig-plates are pressed firmly together, which brings the active surfaces of the switch chips close enough together to allow for capacitive communication between the switch chips. The alignment structures for the switch chips are created with sufficient clearance to allow the switch chip surfaces to abut when the jig-plates are pressed together.

The jig-plates can have conductive interconnect layers in them to carry power, ground, and other signals. These layers can be fabricated into the jig-plates before the jig-plates are polished smooth and the alignment structures are added. These conductive layers can connect to the switch chips using MEMS structures (such as springs, posts and cantilever arms for surface contacts, as well as structures going into cavities) that are patterned onto the jig-plates. When the jig-plates are pressed together, the spring heights and positions are such that the springs connect power, ground, and other signals to the switch chips. The active facing layer of switch chips can contact the spring structures on the opposing jig-plate.

Overlap Patterns

Figure 2:
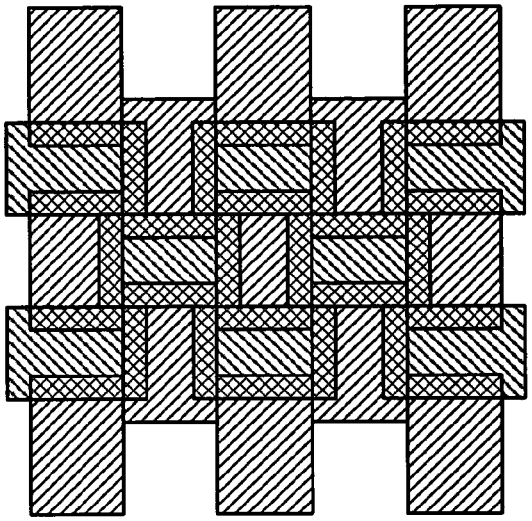
FIG. 2 presents various switch chip overlap patterns in accordance with an embodiment of the present invention.
Figure 2:
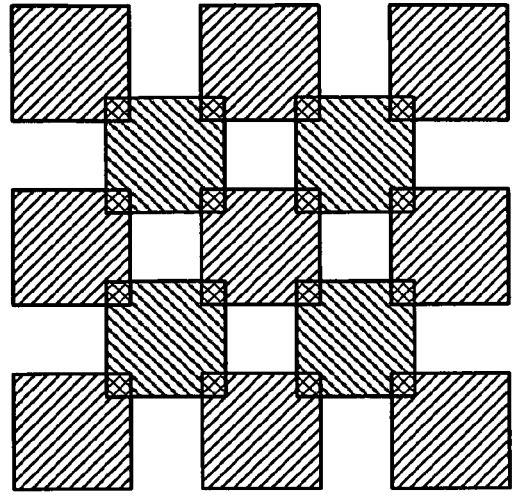
Figure 2:
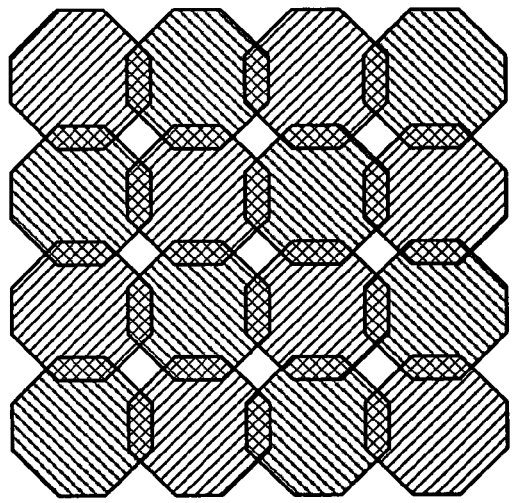
Figure 2:
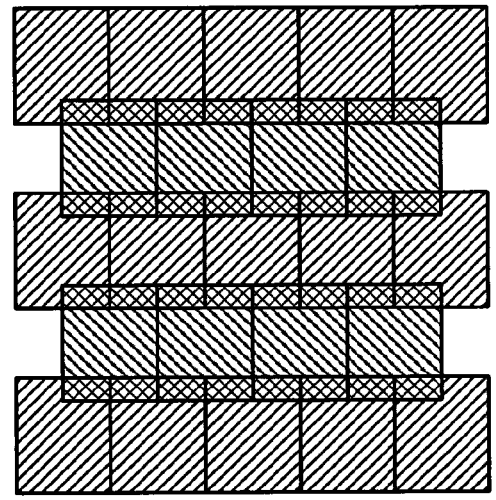
Figure 2:
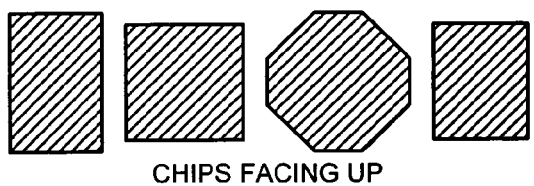
Figure 2:
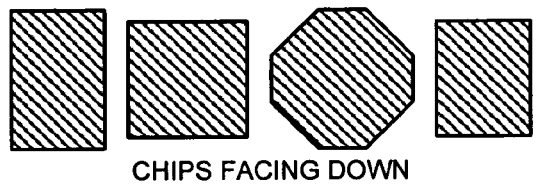
Figure 2:

FIG. 2 presents various overlap patterns for switch chips in accordance with an embodiment of the present invention. Each pattern offers a different amount of overlap between switch chips. In some instances it might be better to maximize the overlap between switch chips, such as in herringbone 202 and mosaic 206, while in other instances it might be better to maximize space between switch chips to facilitate heat removal, such as in checkerboard 204 and tight checkerboard 208.

Various tradeoffs exist with each pattern as well. More overlapping connections between switch chips might result in better bandwidth between switch chips, but conversely, more of the switch chip is being used for chip-to-chip communication and less of the switch chip is being used for other functions of the switch chip. Specific switch chip arrangements might prove to be optimal for specific types of switch chips as well.

Multiprocessor System Using a Proximity I/O Switch

Figure 3:
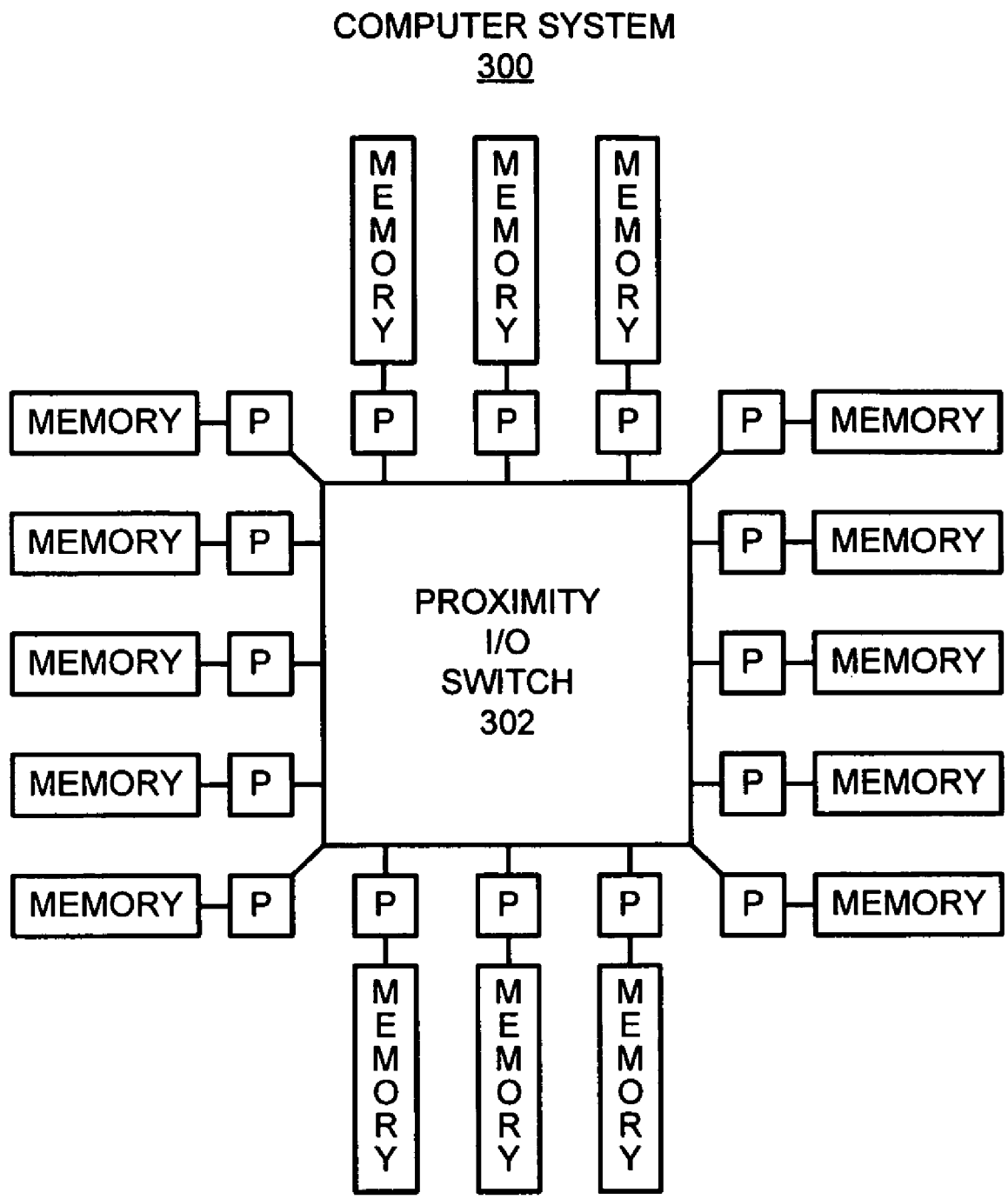
FIG. 3 illustrates a multiprocessor system wherein processors communicate with each other through a proximity I/O switch in accordance with an embodiment of the present invention.

FIG. 3 illustrates a multiprocessor system 300 wherein processors communicate with each other through a proximity I/O switch 302 in accordance with an embodiment of the present invention. In the multiprocessor system illustrated in FIG. 3, a ring of processor chips (labeled with the letter P) surrounds proximity I/O switch 302. These processor chips communicate with each other through proximity I/O switch 100.

The processor chips are coupled to associated memories (which can for example be Dual In-line Memory Modules (DIMMs)) that contain memory for the associated processor chips.

In a larger multiprocessor system, proximity I/O switch 302 can be surrounded by multiple rings of processor chips. Additionally, proximity I/O switch 302 can be coupled to other devices, such as electrical-to-optical transceiver chips, peripheral devices, and network interfaces, as well as bridge chips, which connect computer system components together.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for transferring data between components in a computer system, comprising:
   a proximity I/O switch configured to transfer data between the components in the computer system;
   wherein the proximity I/O switch is comprised of multiple switch chips which are coupled together and are configured to collectively function as a switch; and
   wherein the multiple switch chips in the proximity I/O switch are configured to communicate with the components in the computer system through capacitive and/or conventional non-capacitive communication mechanisms.

2. The apparatus of claim 1, wherein the multiple switch chips are configured to communicate with each other through capacitive coupling, whereby the multiple switch chips can communicate with each other without being constrained by the limitations of conventional non-capacitive communication mechanisms.

3. The apparatus of claim 1, wherein the multiple switch chips are alternately oriented face-up and face-down in an array, so that capacitive communication surfaces on active faces of the multiple switch chips overlap, thereby facilitating capacitive communication between the multiple switch chips.

4. The apparatus of claim 3, wherein the array of switch chips is two-dimensional so that corners of alternately oriented (face-up and face-down) switch chips overlap.

5. The apparatus of claim 4, the multiple switch chips in the array are permanently or removably attached to one or more Micro-Electro-Mechanical System (MEMS) jig-plates, which are fabricated to accommodate the multiple switch chips.

6. The apparatus of claim 4, wherein switch chips on the perimeter of the two-dimensional array of switch chips are configured to communicate with the components in the computer system through the conventional non-capacitive communication mechanisms.

7. The apparatus of claim 1, wherein the conventional non-capacitive communication mechanisms can include:
  electrically conductive connections; and
  optical communication mechanisms.

8. The apparatus of claim 1, wherein the components in the computer system include:
  processors;
  memories;
  peripheral devices; and
  network interfaces.

9. A computer system including a proximity I/O switch for transferring data, comprising:
  a processor;
  a memory;
  a proximity I/O switch configured to transfer data between the components in the computer system, wherein the components include the processor and the memory;
  wherein the proximity I/O switch is comprised of multiple switch chips which are coupled together and are configured to collectively function as a switch; and
  wherein the multiple switch chips in the proximity I/O switch are configured to communicate with the components in the computer system through capacitive and/or conventional non-capacitive communication mechanisms.

10. The computer system of claim 9, wherein the multiple switch chips are configured to communicate with each other through capacitive coupling, whereby the multiple switch chips can communicate with each other without being constrained by the limitations of conventional non-capacitive communication mechanisms.

11. The computer system of claim 9, wherein the multiple switch chips are alternately oriented face-up and face-down in an array, so that capacitive communication surfaces on active faces of the multiple switch chips overlap, thereby facilitating capacitive communication between the multiple switch chips.

12. The computer system of claim 11, wherein the array of switch chips is two-dimensional so that corners of alternately oriented (face-up and face-down) switch chips overlap.

13. The computer system of claim 12, wherein the multiple switch chips in the array are permanently or removably attached to one or more Micro-Electro-Mechanical System (MEMS) jig-plates, which are fabricated to accommodate the multiple switch chips.

14. The computer system of claim 12, wherein switch chips on the perimeter of the two-dimensional array of switch chips are configured to communicate with the components in the computer system through the conventional non-capacitive communication mechanisms.

15. The computer system of claim 9, wherein the conventional non-capacitive communication mechanisms include:
  electrically conductive connections; and
  optical communication mechanisms.

16. The computer system of claim 9, wherein the components in the computer system include:
  processors;
  memories;
  peripheral devices; and
  network interfaces.

17. A method for transferring data between components in a computer system, comprising:
  transferring data between the components in the computer system through a proximity I/O switch;
  wherein the proximity I/O switch is comprised of multiple switch chips which are coupled together and are configured to collectively function as a switch; and
  wherein the multiple switch chips in the proximity I/O switch communicate with the components in the computer system through capacitive and/or conventional non-capacitive communication mechanisms.

18. The method of claim 17, wherein the multiple switch chips communicate with each other through capacitive coupling, whereby the multiple switch chips can communicate with each other without being constrained by the limitations of conventional non-capacitive communication mechanisms.

19. The method of claim 17, wherein the multiple switch chips are alternately oriented face-up and face-down in an array, so that capacitive communication surfaces on active faces of the multiple switch chips overlap, thereby facilitating capacitive communication between the multiple switch chips.

20. The method of claim 19, wherein the array of switch chips is two-dimensional so that corners of alternately oriented (face-up and face-down) switch chips overlap.

21. The method of claim 20, wherein the multiple switch chips in the array are permanently or removably attached to one or more Micro-Electro-Mechanical System (MEMS) jig-plates, which are fabricated to accommodate the multiple switch chips.

* * * * *